United States Patent
Lin et al.

(10) Patent No.: US 6,831,853 B2
(45) Date of Patent: Dec. 14, 2004

(54) APPARATUS FOR CLEANING A SUBSTRATE (75) Inventors: Wesley Lin, Hsin-Chu (TW); Jhon-Jhy Liaw, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 85 days.

(21) Appl. No.: 10/299,931

(22) Filed: Nov. 19, 2002

(65) Prior Publication Data

US 2004/0095800 A1 May 20, 2004

(51) Int. Cl.[7] ................................................ G11C 11/00

(52) U.S. Cl. ........................ 365/154; 365/210; 365/194

(58) Field of Search ................................. 365/154, 210, 365/194, 189.09, 203, 205

(56) References Cited

U.S. PATENT DOCUMENTS

| | | |
|---|---|---|
| 5,193,076 A | 3/1993 | Houston |
| 5,245,584 A | 9/1993 | Zampaglione et al. |
| 5,268,869 A | 12/1993 | Ferris et al. |
| 6,094,379 A | 7/2000 | Sago |
| 6,172,925 B1 | 1/2001 | Bloker |
| 6,282,133 B1 * | 8/2001 | Nakagawa et al. ......... 365/194 |
| 6,285,604 B1 | 9/2001 | Chang |

* cited by examiner

Primary Examiner—David Lam
(74) Attorney, Agent, or Firm—Slater & Matsil, L.L.P.

(57) ABSTRACT

A memory device includes a number of memory cells 112 arranged in rows and columns. Each memory cell 112 is coupled to a wordline 120 and at least one bitline 126 and/or 128. Each bitline 126 (128) is coupled to a sense amplifier 130, which is enabled by a sense amplifier enable circuit 134. The sense amplifier enable circuit 134 is coupled to the dummy bitline. This circuit provides the enable signal at a time based on an amount of leakage voltage determined from the dummy bitline.

25 Claims, 10 Drawing Sheets

APPARATUS FOR CLEANING A SUBSTRATE

TECHNICAL FIELD

The present invention relates generally to integrated circuits, and more particularly to a system and method for controlling an SRAM sense amplifier clock.

BACKGROUND

Semiconductor memory devices are used in a wide variety of contexts. One type of memory is a static random access memory (SRAM). This type of memory is considered static since it will retain its state without need for refresh. A system that utilizes an SRAM will typically have dedicated SRAM memory chips or will include other the memory on-chip with other circuitry, e.g., embedded memory. The present invention is applicable in either case.

Figure 1:
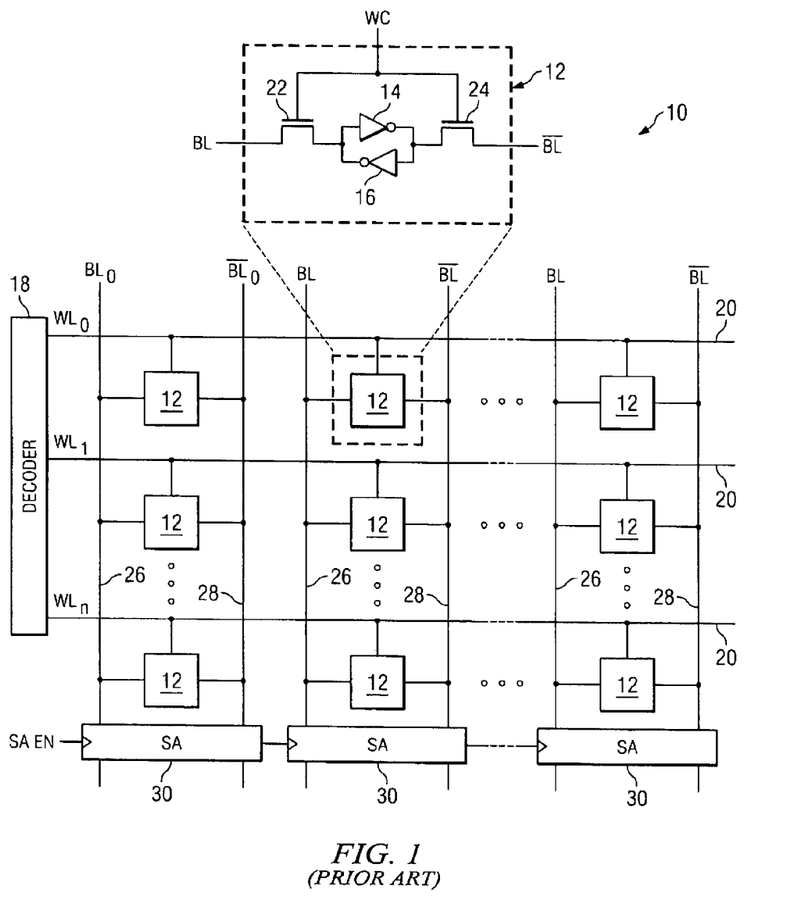
FIG. 1 is a schematic diagram of a known SRAM array.

FIG. 1 shows a simplified schematic diagram of an array 10 of SRAM cells 12. One cell 12 is shown in detail and includes a cross-coupled pair of inverters 14 and 16. In the typical embodiment, each inverter includes an n-channel metal oxide semiconductor (NMOS) transistor coupled in series with a p-channel metal oxide semiconductor (PMOS) transistor. The input of one of the inverters is coupled to the output of the other inverter so that state will be latched.

To select one of the memory cells 12, the row decoder 18 drives one of the wordlines 20 to a high voltage level. The high voltage on the wordline will cause the pass transistors 22 and 24 to become conductive thereby transferring the state of the memory cell to the respective pair of bitlines 26 and 28. As shown in the figure, the bitline pair will include a bitline BL (labeled 26) and a complementary bitline BLb (labeled 28) that carries a level that is opposite that on the bitline.

Sense amplifier 30 amplifies the voltage difference between the complementary bitlines 26 and 28. The data can then be routed out of the array by circuitry that is not shown. The sense amplifier 30 is enabled by an enable or clock signal labeled SA_EN. The timing of this sense amplifier signal SA_EN is important. If the sense amplifier 30 is triggered before the bitline pair 26/28 has been sufficiently charged then the output of the sense amplifier 30 could be incorrect. On the other, any unnecessary delay in the sense amplifier enable signal SA_EN will lower the operation speed of the memory array.

SUMMARY OF THE INVENTION

The preferred embodiment of the present invention provides a technique for controlling the timing of the sense amplifier enable signal. This preferred technique compensates for leakage of unselected devices that might slow down the selected devices ability to charge up the bitline. In one aspect, the concept is to use an additional dummy off-cell bitline to monitor and simulate the leakage effect. When leakage occurs on real bit line circuit, the sense amplifier will automatically slow down his enable timing.

In known memory circuits, there are at least two methods in controlling a sense amplifier clock: the delay chain method and the dummy bit line current tracking method. This patent is aimed to overcome leakage problems with these, as well as other methods.

In a first embodiment, an additional dummy bit line can be provided to control the supply voltage of the delay chain in a traditional delay chain sense amplifier clock control. When bit line leakage occurs in the core array, the dummy bit line, which includes cells like those in the array, will drop its voltage as well. This drop will cause the delay chain speed to slow down.

In a second embodiment, a low active circuit can be used to select from multiple delay chain. This selection can be based on the additional dummy bit line voltage level. The slower delay chain will be turn on while the more bit line leakage.

In a third embodiment, the dummy bitline can be used to directly control the loading of the delay chain. When more leakage occurs on the dummy cells, the loading of delay chain will increase. This increased loading will cause the speed of the delay chain to slow down.

In the case that utilizes the dummy bit line current tracking method, the circuit can use a dummy on-cell bitline and a dummy off-cell bit line along with a voltage level (or current level) subtractor to simulate the real bit line pair. The difference voltage between the dummy on bitline and the dummy off bitline will control the sense amplifier clock timing.

The above concept can also be used to accomplish fine control method. In this embodiment, a dummy on-cell bitline and a dummy off-cell bit line can be used with a voltage level subtractor to control the supply voltage of single delay chain or to select one of multiple delay chain. Another method is to use a dummy on-cell bitline and a dummy off-cell bitline to control the loading of a delay chain. The more on-cell current the more the loading is decreased and the more off-cell leakage, the more loading increased.

In certain embodiments, the present invention provides an effective method to overcome the leakage influence in voltage differences between the two bitlines in a complementary pair. If leakage occurs, the sense amplifier will automatically slow down its timing. During normal condition when no leakage occurs, the sense amplifier will not be affected. As a result, one advantage is that the preferred embodiment keeps the same speed as traditional designs in normal condition, and only slows down the sense amplifier speed to match the bitline speed when leakage occurs.

BRIEF DESCRIPTION OF THE DRAWINGS

For a more complete following descriptions taken in conjunction with the accompanying drawings, in which understanding of the present invention, and the advantages thereof, reference is now made to the:

FIGS. 2b and 2c are timing diagrams of the array of FIG. 2a;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described in context of a specific kind of memory, namely static random access memory or SRAM. It is understood that the invention also applies to other memory and other types of SRAM. After discussing a problem with the prior art, the present invention will provide a number of potential solutions in the context of specific embodiments.

Over time, the devices used to build integrated circuits are becoming smaller and smaller. In deep sub-micron technology, the gate oxide of the transistors is thin and the threshold voltage is low. These factors can induce large subthreshold leakage and gate leakage for transistors that are off. Referring to FIG. 1, this problem can be significant for transistors 22 and 24 in unselected rows. For example, assume a worst-case scenario where all of the unselected bits store a "0" and the data of the read bit is a "1". The total leakage from the unselected bits increase the time for the selected cell to charge the bitline. If the sense amplifier is enabled before the bitline sufficiently charges, the wrong data could be latched.

In one aspect, the present invention provides for the use of a dummy off-cell bitline to monitor and simulate the leakage effect. When leakage occurs on the real bitline circuit, the sense amplifier can be slowed down. The following descriptions will provide several examples of how this and other concepts can be implemented.

Figure 2A:
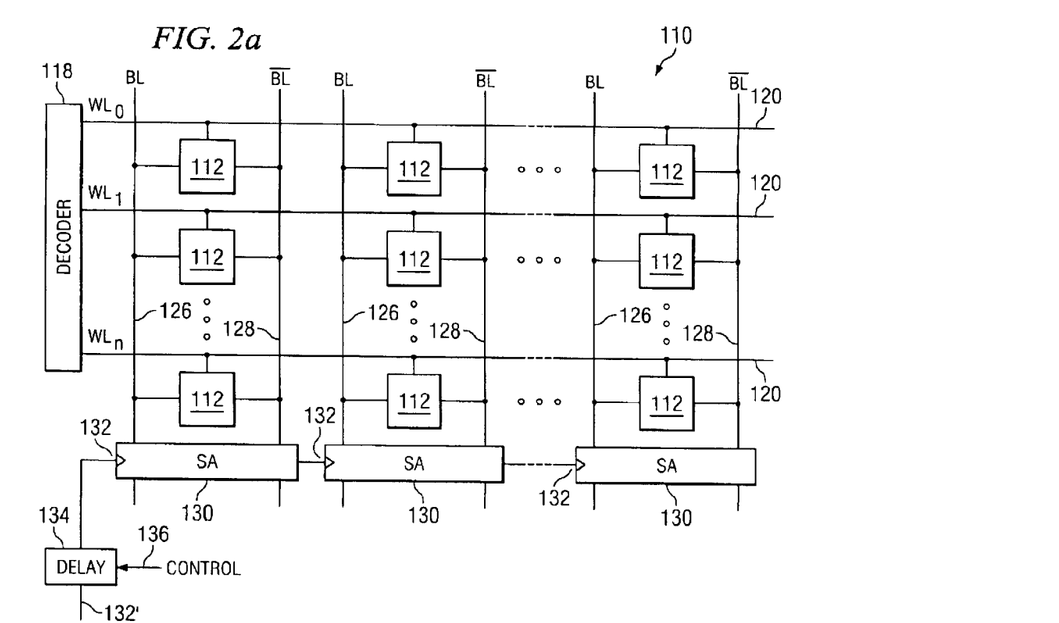
FIG. 2a is a schematic diagram of an memory array of the present invention.

FIG. 2a shows a portion of a memory array 110 that is similar to the memory array 10 described with respect to FIG. 1. For the sake of simplicity, not all of the discussion related to FIG. 1 will be repeated here.

As was shown in FIG. 1, each of the memory cells 112 can comprise a 6 T SRAM cell. Accordingly, each of the memory cells is coupled between a complementary pair of bitlines 126 and 128. In various embodiments, different numbers of cells can be coupled to the bitlines 126 and 128. In preferred embodiments, there could be 1024, 512, 256, 128 or 64 memory cells per bitline. Other numbers of cells are also envisioned.

In an alternate embodiment, the memory cells could be 5 T SRAM cells, where one of the access transistors 22 or 24 is eliminated, or 8 T SRAM cells, where an additional access transistor is coupled in series with transistors 22 and 24. In other embodiments, other types of memory cells such as dynamic random access memory (DRAM), non-volatile memory (e.g., electrically programmable read only memory, electrically erasable programmable read only memory, flash) and magnetic memory (e.g., ferroelectric random access memory or FRAM, magneto-resistive random access memory or MRAM).

Each complementary bitline pair 126/128 is provided to a sense amplifier 130. The sense amplifier 130 can be any known sense amplifier. In the case where the memory cell 112 includes only one terminal coupled to the bitline 126 or 128, the second input to the sense amplifier could receive either a reference line or an unselected bitline, as two examples.

Each sense amplifier 130 includes an enable input 132. When an enable signal (e.g., a clock signal) is received at the enable input 132, the sense amplifier will become operational. The timing of this signal can be important to the operation of the circuit. If the signal arrives too early then the sense amplifier might amplify the wrong state. On the other hand, if the signal arrives too late then the memory will be operating at less than the highest possible speed.

In the embodiment of FIG. 2a, the sense amplifier enable signal is provided through a delay circuit 134. Although not shown, the delay circuit 134 will receive a signal that has timing based on the decode signals of row decoder 118. For example, the delay circuit 134 can be fed by a dummy wordline 132' that is activated when any wordline 120 in the array is activated. The delay of delay circuit 134 is selected so that the sense amplifier 130 will activate at a time when the differential voltage across the bitline pair 126/128 is sufficient to be sensed.

Figure 2B:
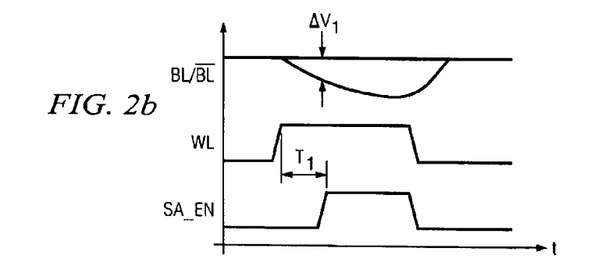

The operation of the circuit of FIG. 2a will now be discussed with reference to the timing diagram of FIG. 2b. As shown in the figure, both the bitline BL and complementary bitline BLb are precharged to a high voltage level, e.g., 2.5V. To begin the read operation, one of the wordlines 120 is activated to select the desired array cells 112. As the same time, a dummy wordline signal (or sense amplifier control signal) is applied to delay 134. The dummy wordline signal 132' is shown in FIG. 2b at the line labeled WL. After some delay time $T_1$, which is determined by delay 34, the sense amplifier enable signal 132 (labeled as SA_EN) will go high thereby activating the sense amplifiers 130. The selected time is typically chosen to allow a sufficient voltage difference $\Delta V_1$, e.g., 100 mV, to be established between the bitlines 126 and 128.

As discussed above, leakage of the unselected cells can affect the time to charge the bitlines. For example, if the selected cell stores a physical "1" but a number of the unselected cells store physical "0"s, then leakage of the unselected cells will tend to pull the bitline lower. These phenomena will increase the time that it takes for the selected cell to charge the bitlines to a level sufficient to be sensed by the sense amplifier 130.

Figure 2C:
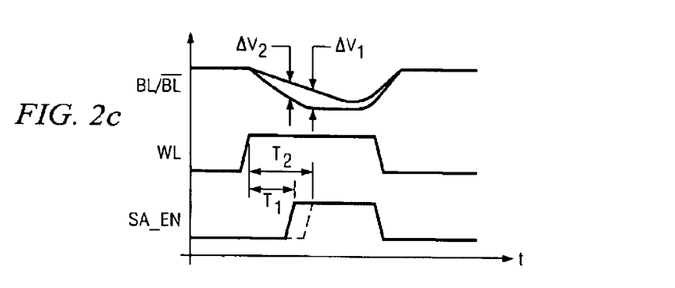

FIG. 2c illustrates the operation when the bitlines experience leakage from unselected cells. Once again, the bitlines 126 and 128 are precharged to a high voltage level. Upon activation of the wordline 102, one of the bitline pair 126 or 128 will start to be driven low by the selected memory cell. Rather than staying high, the other bitline of the pair will also start to drop due to leakage from unselected cells. In this case, the voltage difference after time period $T_1$ will be $\Delta V_2$, which is less than the desired voltage difference $\Delta V_1$. This smaller difference may not be properly sensed by the sense amplifier 130 leading to a leakage induced read failure.

To compensate for this leakage, the delay circuit includes a control node 136. This control node will carry information related to an amount of leakage voltage. Using this information, the sense amplifier enable signal 132 can be delayed. In FIG. 2c, this delay is shown by the dotted line where the sense amplifier enable signal SA_EN goes high a time $T_2$ after the wordline WL. At this time, the voltage difference between the bitlines 126 and 128 has reached the necessary $\Delta V_1$ volts, e.g., 100 mV.

Figure 4:
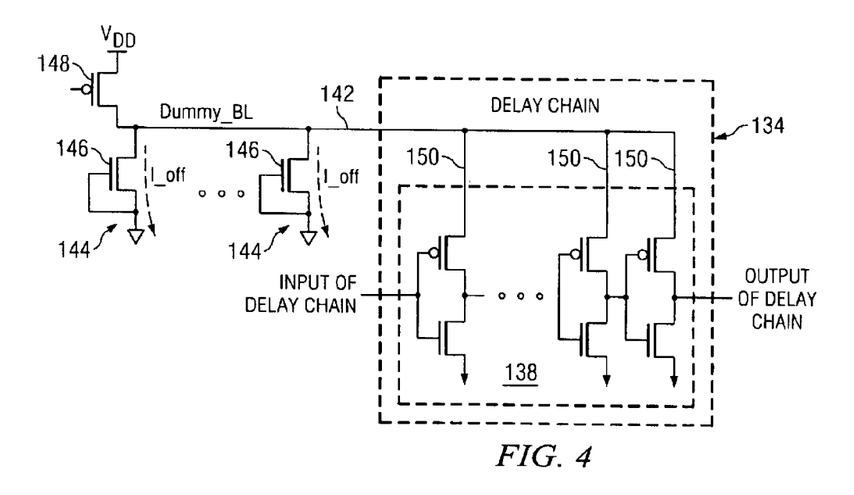
FIG. 4 is a second embodiment circuit of the present invention.
Figure 5:
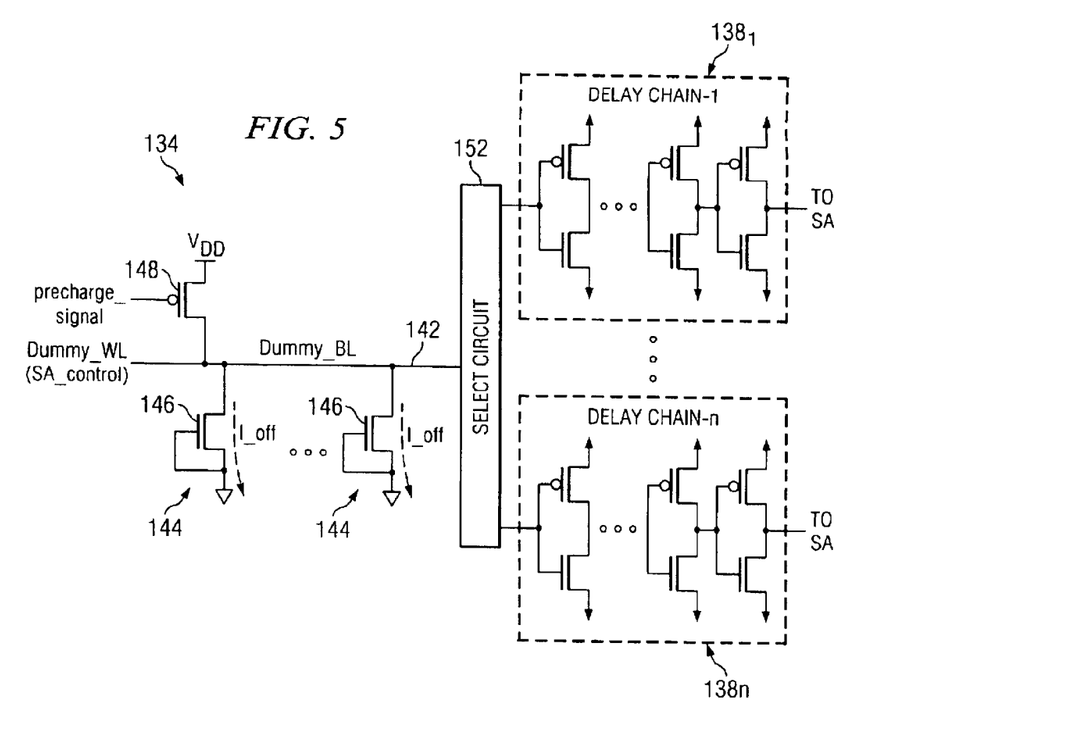
FIG. 5 is a third embodiment circuit of the present invention.

The leakage-related information can be in the form of an analog signal (see e.g., FIG. 4) or in the form of a digital signal (see e.g., FIG. 5). In the preferred embodiment, the amount of leakage voltage is determined from a dummy bitline that has been provided to simulate the leakage on an actual bitline. A dummy bitline is useful since the memory cells, especially the select transistor, included with the dummy bitline will have been formed using the same processes as were used to form the memory cells in the array.

The following discussion will provide a number of examples of how this concept can be utilized. While these are not the only choices, the following embodiments will provide one of ordinary skill in the art with an understanding how other embodiments could be implemented.

Figure 3:
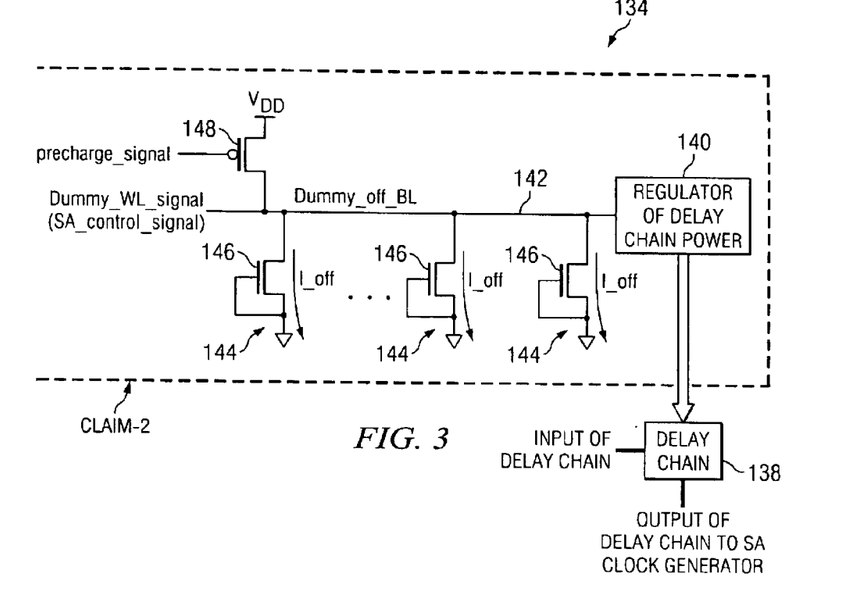
FIG. 3 is a first embodiment circuit of the present invention.

Referring to FIG. 3, the delay circuit 134 includes a delay chain 138 and a regulator 140, which regulates the power provided to the delay chain. In this example, the delay of a signal, e.g., the sense amplifier enable signal, traversing the delay chain 138 will be adjusted based on the power level provided by regulator 140. Any type of delay element 134 can be used. Therefore, if the leakage is great then the power can be lowered thereby slowing the delay. On the other hand, if the leakage is small, the power level will be higher so that the delay will be shorter.

In the preferred embodiment, the regulator 140 is coupled to a dummy bitline 142. Dummy bitline 142 includes a number of dummy memory cells 144. For example, the dummy bitline can include five to ten SRAM cells. The number of cells can vary depending on the process and the speed requirements. In the preferred embodiment, is identical to the array cells. In an alternate embodiment, each dummy cell includes a transistor 146 with its gate and source coupled to ground. In this configuration, the dummy cell simulates a memory cell that stores a physical "0" and is not selected. The transistor 146 is preferably identical in size and made by the same process as select transistors 22 and 24 of the array memory cells. In the case where the array includes 8 T cells, two access transistors 146 can be included in parallel. In the figures, any one of these choices of dummy cells is drawn schematically with the same symbol.

The dummy bitline 142 is coupled between the chip reference voltage $V_{DD}$ and the regulator 140. In operation, pre-charge transistor 148 is closed so that dummy bit line 142 is charged to a full $V_{DD}$ volts. In the preferred embodiment, pre-charge transistor 148 is a p-channel MOS transistor. In timing a related to the decoders, the pre-charge transistor 148 is turned off. Over time, the voltage level of the dummy bitline 142 will be reduced due to leakage of transistors 146. The leakier the transistors, the more quickly the dummy bitline 142 will discharge toward ground. The regulator 140 is configured to sense the voltage along the dummy bitline 142.

FIG. 4 shows one configuration where this technique is used. In FIG. 4, the dummy bitline 142 is coupled to the reference voltage node 150 of each of the inverters that make up delay chain 138. As shown in the figure, each of the inverters is made up of serially coupled NMOS and PMOS transistor. The numbers of inverters is selected to control the delay and may typically include four to ten stages (e.g., stage including a single inverter). Other components such as capacitors can also be included in the delay chain (see e.g., FIG. 8). The components of delay chain 134 are typically fabricated using the normal design rule, e.g., 90 nm.

In this embodiment, the speed at which the inverters will transition states will be a function of the voltage level at the reference voltage node 150. Since this node is coupled to the dummy bitline 142, the voltage level will be lowered when the cells are leaky. Since the dummy cells 144 were designed to simulate the array select transistors, this leakage will simulate any leakage that could potentially slow down the charging of the bitlines 126 and 128.

FIG. 5 illustrates an alternate embodiment. In this embodiment, the sense amplifier enable circuit 134 includes a plurality of delay chains $138_1$–$138_n$. Each of the delay chains $138_1$–$138_n$ will have a different delay (e.g., a different number of inverters). The sense amplifier enable circuit 134 further includes a select circuit 152, which is provided to select one of the delay chains $138_1$–$138_n$ based on the amount of leakage voltage determined from the dummy bitline 142. In the preferred embodiment, the delay select circuit is an active low circuit that uses the dummy bitline voltage to choose one of delay chains $138_1$–$138_n$. When there is more leakage, the slower delay chain will be selected.

Figure 6:
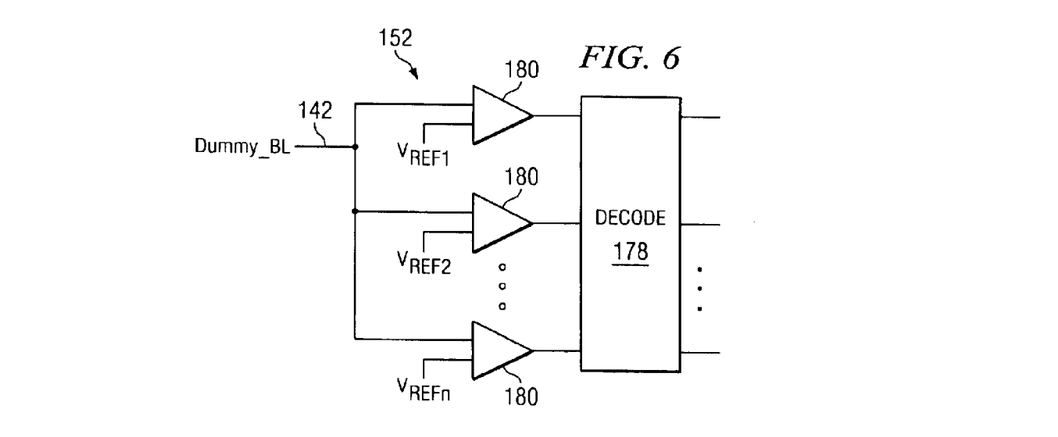
FIG. 6 is an example of a select circuit for use with the embodiment of FIG. 5.

FIG. 6 provides a view of an embodiment for delay select circuit 152. In this embodiment, the dummy bitline 142 is provided to a number of comparators 180. Each comparator also receives a reference voltage $V_{REFn}$. The outputs of the voltage comparators 180 will collectively create a thermometer-scale digital word that indicates the value of the voltage on the dummy bitline 142. This digital word can then be decoded by decode circuit 178 to select one of the delay chains.

Figure 7:
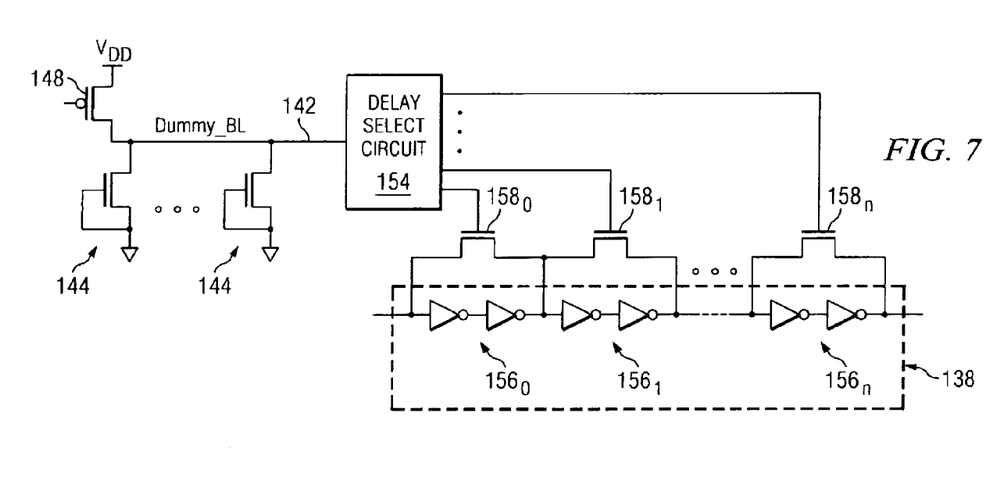
FIG. 7 is a fourth embodiment circuit of the present invention.

FIG. 7 shows an alternate embodiment where a delay select circuit 154 selects the length of delay in a delay chain 138. In this case, the delay chain 138 includes a plurality of delay stages $156_0$–$156_n$. A bypass transistor 158 is associated with each of the delay stages 156. The delay select circuit can activate any number of these bypass transistors 158 in order to obtain the appropriate delay. In one embodiment, each stage $156_0$ might have a delay equal to $2^0$ units. With this binary-weighted configuration, a delay of any discrete number of units between 0 and $2^n$ can be achieved.

Figure 8:
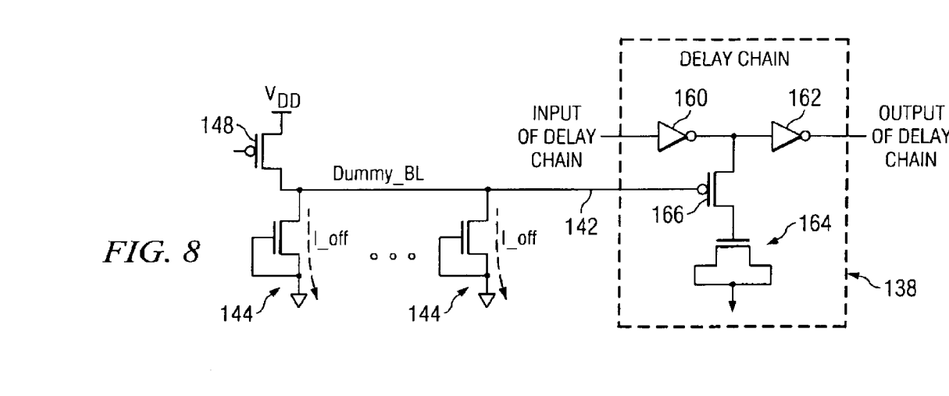
FIG. 8 is a fifth embodiment circuit of the present invention.

FIG. 8 illustrates yet another embodiment. In this embodiment, the dummy bitline 142 controls the loading of the delay chain. When more leakage occurs on the cells 144 (and 112), the loading of the delay chain 138 will increase so that the speed of the delay chain 138 will decrease. In this particular embodiment, the delay chain includes a first inverter 160 serially coupled to a second inverter 162. While only two inverters are shown, it is understood that more (or fewer) delay elements can be used.

The delay chain is loaded by a capacitor 164. In this case, the capacitor 164 is formed from a MOS (e.g., NMOS) transistor that is wired so that both the source and drain are coupled to a common point (e.g., ground). The circuit also includes a switch 166 coupled between the node between the first and second inverters 160 and 162 and a plate of the capacitor 164. In the preferred embodiment, the switch 164 comprises a PMOS transistor with its gate coupled to the dummy bitline 142. As the voltage on the dummy bitline 142 decreases, the PMOS transistor 166 will become more conductive thereby further loading the delay chain 138.

Figure 9:
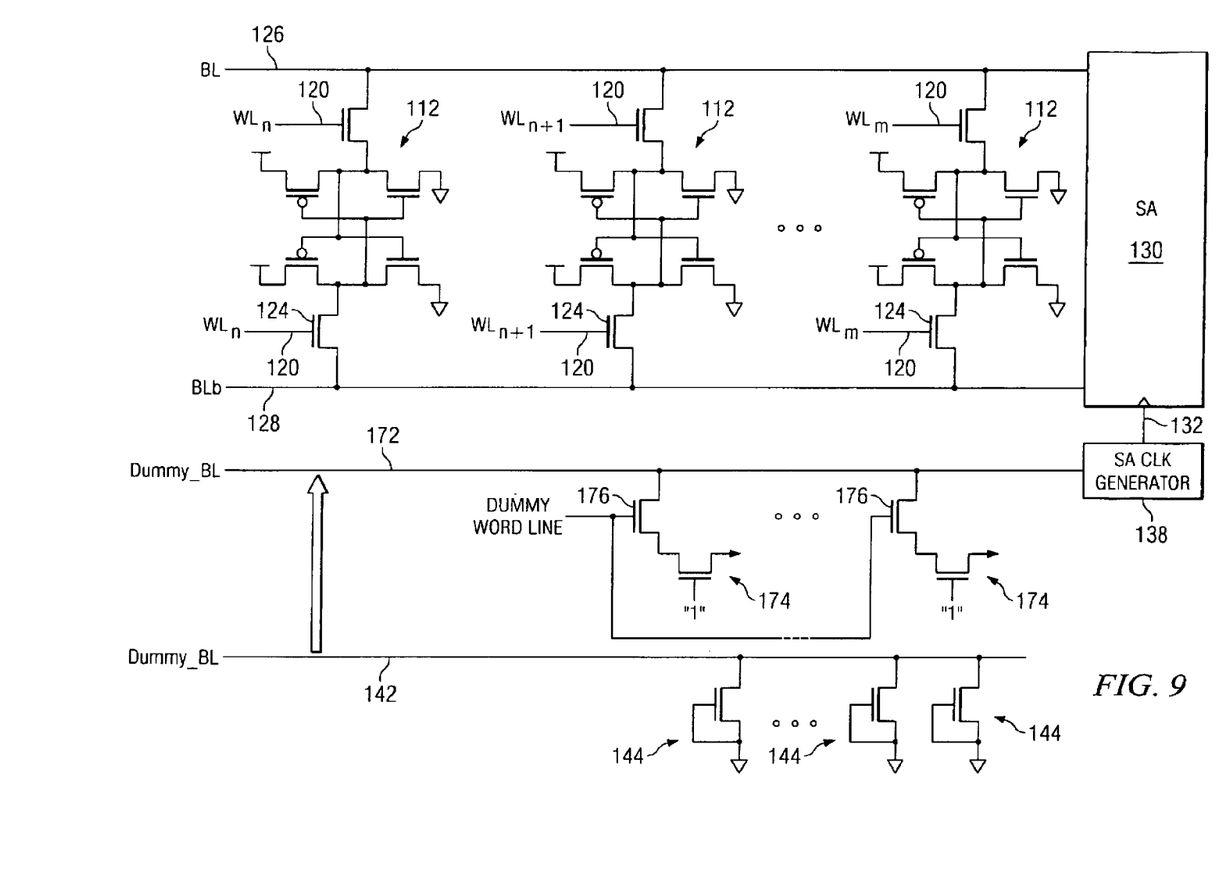
FIG. 9 is a sixth embodiment circuit of the present invention.

FIG. 9 illustrates a second technique used to determine the timing of the sense amplifier 130. In this case, the sense amplifier enable (e.g., clock) is generated using the current tracking method. Dummy bitline 172 is coupled to sense amplifier clock generator 138, which can be a fixed delay element. In this embodiment, dummy bitline 172 is a "dummy on bitline" since the dummy cells are each turned on during operation. The dummy cells store a high voltage level (physical "1") that is transferred to the dummy bitline in response to the dummy wordline. The clock generator 138 will activate the sense amplifier 130 once the dummy bitline is charged.

In operation, the row decoder (118 in FIG. 2a) will activate one of the wordlines 120 to turn on the selected cells. Simultaneously, the dummy wordline will turn on transistors 176 to transfer the high voltage level stored in the dummy cells 144 to the dummy bitline 142. The dummy on bitline is used to control or trigger the sense amplifier clock generator 138. In this manner, the wordline to sense amplifier enable timing is controller by the delay timing of the dummy on bitline.

Once again, the present invention provides embodiments that can sense the amount of leakage and adjust the timing of the sense amplifier enable signal 132 to compensate for this leakage. To illustrate this point, FIG. 9 includes a dummy off bitline 142, which can be utilized to adjust the timing of the dummy on bitline 172. The following figures will provide several exemplary embodiments that illustrate concepts of this portion of the invention.

Figure 10:
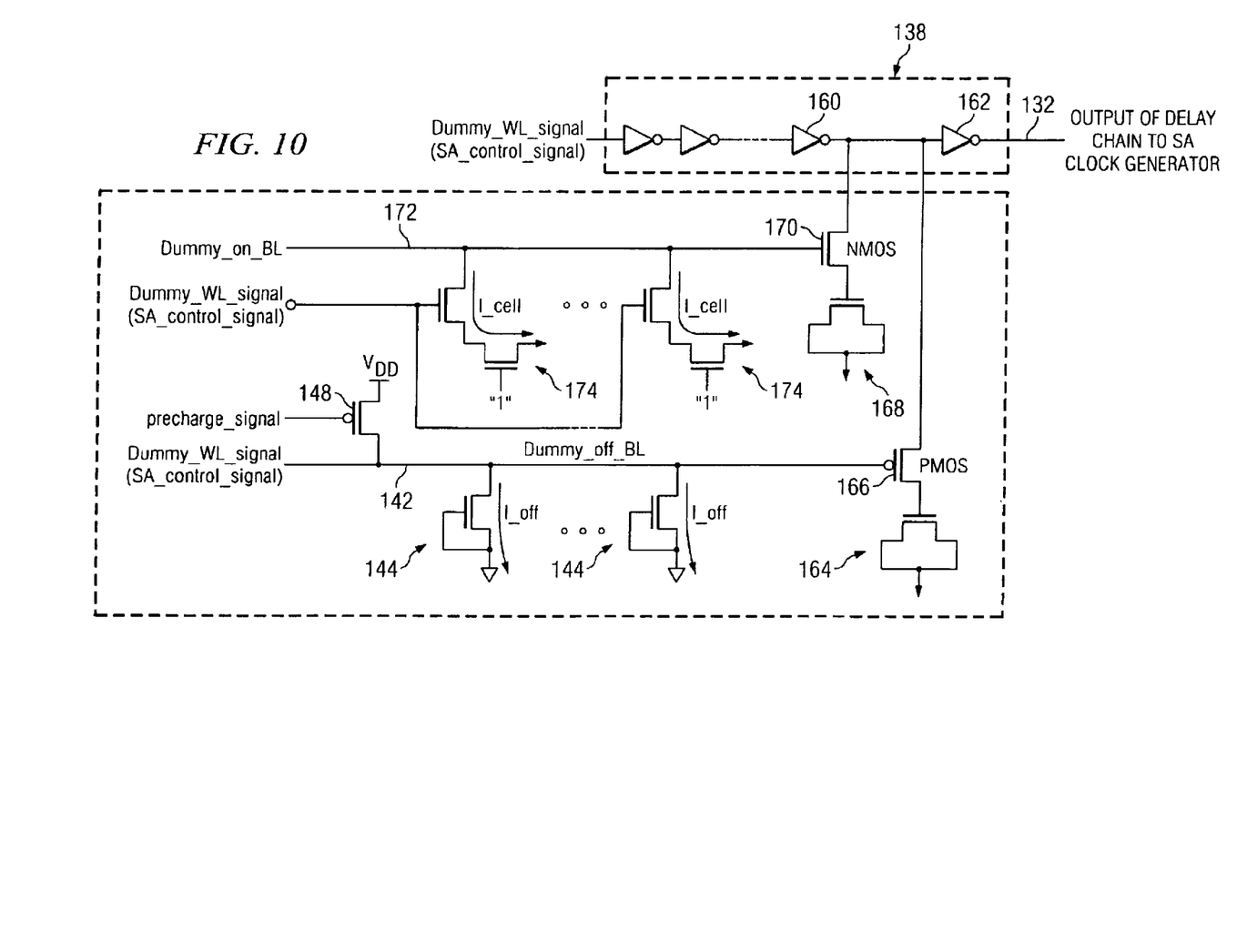
FIG. 10 is a seventh embodiment circuit of the present invention.

FIG. 10 shows an embodiment that is similar to that of FIG. 8. In this embodiment, a second capacitor 168 is further included to load the delay chain 138. A second switch, e.g., NMOS transistor 170, is coupled between the node between the first and second inverters 160 and 162 and a plate of the capacitor 168. The control terminal of this switch, e.g., the gate of NMOS transistor 170, is coupled to a second dummy bitline 172. The second dummy bitline 172 includes a plurality of dummy memory cells 174, at least one of which is in an unselected state. In the preferred embodiment, each of the dummy memory cells 174 of the second dummy bitline 172 is in a selected state.

In operation, the transistor 148 is used to precharge the dummy off bitline 142 to a high voltage level, which turns off PMOS transistor 166. The transistor 148 is then turned off. In accordance with timing from the row address circuitry, the dummy wordline signal is applied to activate the dummy cells 174 in the dummy on bitline 172 and is also applied to the dummy off bitline 142. When there is no leakage through dummy cells 144, the PMOS transistor 166 will remain off. When the cells 144 leak, however, the transistor 166 will begin to turn on thereby loading delay circuit 138. The faster NMOS of the dummy on bitline will "discharge" the voltage of the dummy on bitline 172. Then the NMOS will approach turn-off. The total effect of the faster NMOS on the delay chain will be positive.

Figure 11:
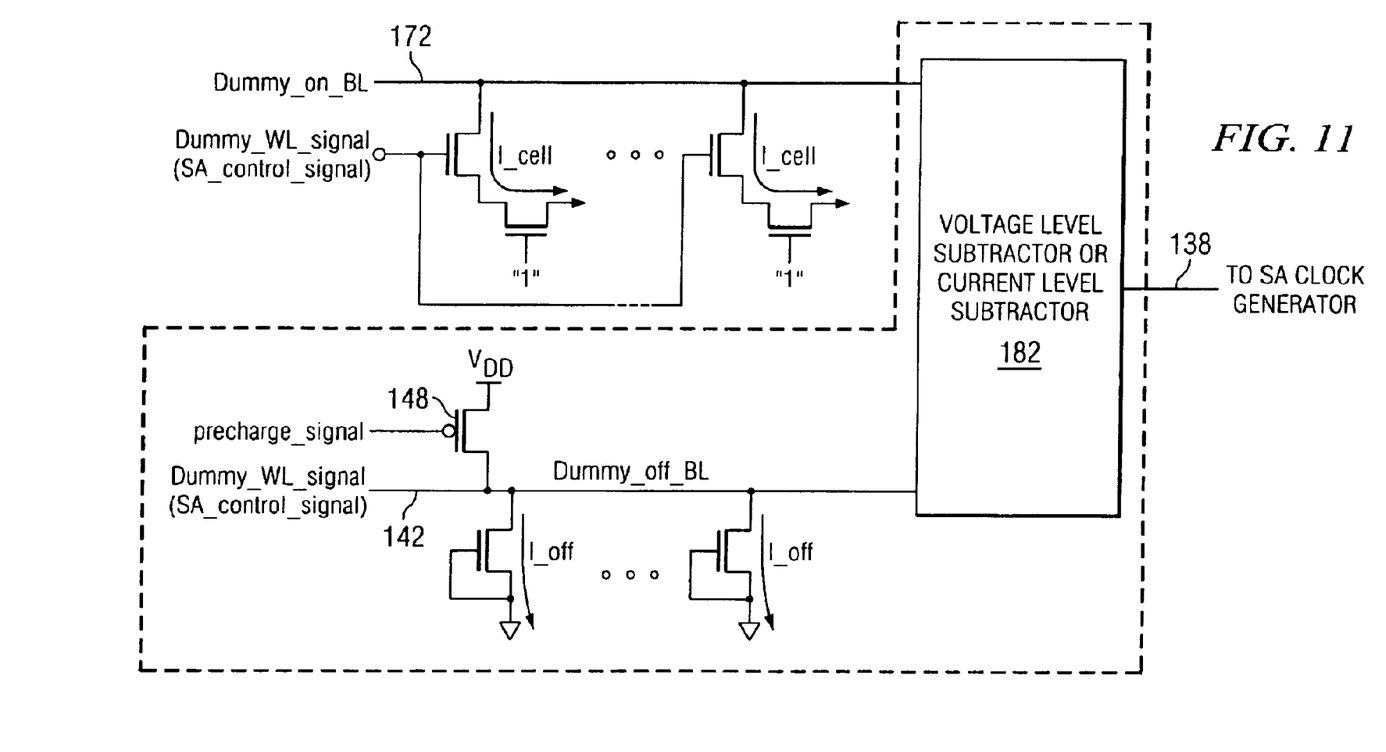
FIG. 11 is a eighth embodiment circuit of the present invention.

FIG. 11 shows an alternate embodiment. In this case, the dummy on bitline 172 is designed to operate as was explained with reference to FIG. 9. The circuit also includes a subtraction circuit 182, which compensates for the dummy off bitline 142. Subtractor circuit 182 can be either a voltage level subtractor or a current level subtractor. Any leakage from the dummy bitline 142 will be compensated for by the subtractor 182. The voltage (or current) level difference of the dummy on bitline 172 and the dummy off bitline 142 will control the sense amplifier clock generator timing. When more leakage occurs on the cell, the low level voltage will delay the trigger of the sense amplifier clock generator thereby slowing the sense amplifier enable signal 132.

Figure 12:
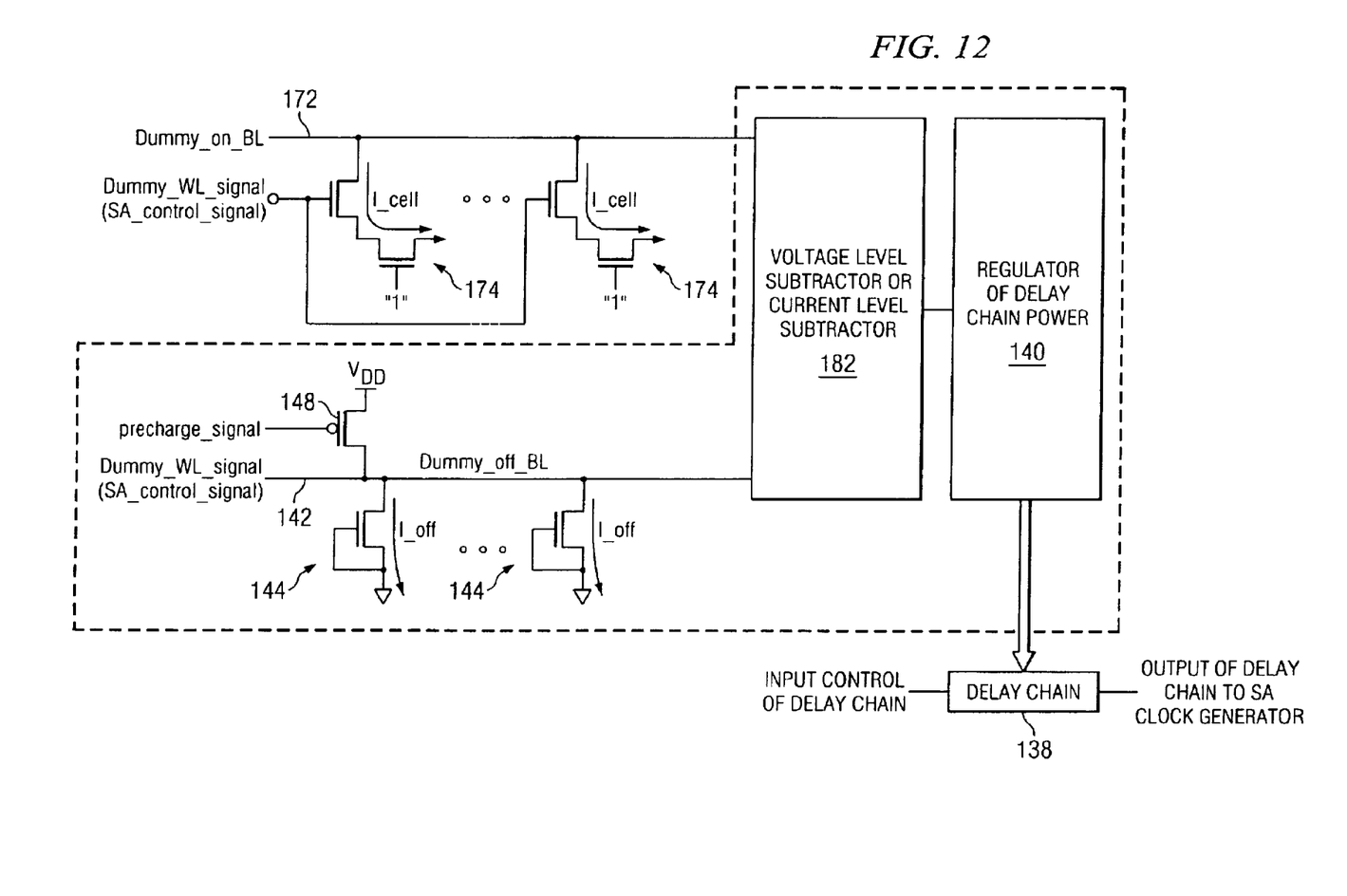
FIG. 12 is a ninth embodiment circuit of the present invention.

FIG. 12 shows an embodiment that controls the supply voltage of a delay chain in a sense amplifier clock generator.

In this embodiment, the voltage (or current) level difference between the dummy on bitline 172 and the dummy off bitline controls the supply voltage of the delay chain 138. When leakage occurs on the dummy cells 144, the supply voltage of the delay chain will degrade such that the speed of the chain will slow down.

Figure 13:
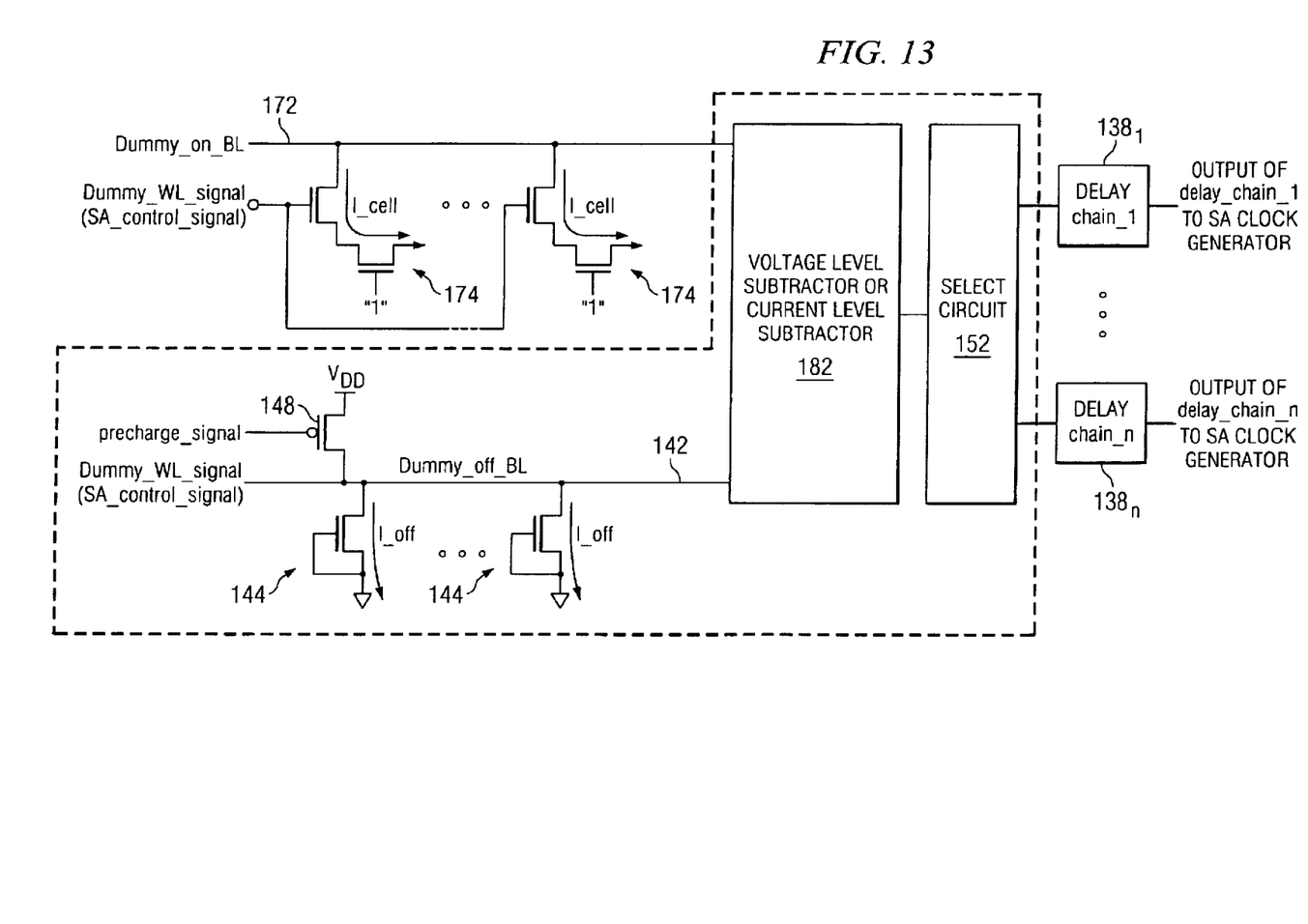
FIG. 13 is a tenth embodiment circuit of the present invention.

FIG. 13 shows an embodiment that is similar to that of FIG. 5 (and FIG. 7). In this embodiment, the voltage (or current) level difference between the dummy on bitline and the dummy off bitline is used to select one of the delay chains in a group of delay chains. The slower delay chain will be selected when the leakage is higher.

FIGS. 12 and 13 have been provided to demonstrate that concepts of various ones of the embodiments can be combined. Not every combination has been explicitly shown here. It should be understood, however, that other embodiments are also envisioned.

The scope of the present application is not intended to be limited to the particular embodiments of the circuit, process, machine, manufacture, means, methods and steps described in the specification. As one of ordinary skill in the art will readily appreciate from the disclosure of the present invention, circuits, components, processes, machines, manufacture, means, methods, or steps, presently existing or later to be developed, that perform substantially the same function or achieve substantially the same result as the corresponding embodiments described herein may be utilized according to the present invention. Accordingly, the appended claims are intended to include within their scope such circuits, components, processes, machines, manufacture, means, methods, or steps.

What is claimed is:

1. A method of operating a static random access memory device, the method comprising:
    selecting a memory cell to be read;
    providing a state of the memory cell to be read to a sense amplifier; and
    enabling the sense amplifier at a time based upon an amount of leakage voltage that is sensed on a dummy bitline.

2. The method of claim 1 and further comprising:
    providing a sense amplifier enable signal;
    delaying the sense amplifier enable signal by an amount based on the sensed leakage voltage; and
    applying the delayed sense amplifier enable signal to the sense amplifier to enable the sense amplifier.

3. The method of claim 2 wherein the sense amplifier enable signal is delayed by lowering a supply voltage to delay circuit carrying the sense amplifier enable signal, the amount of lowering being based on the sensed leakage voltage.

4. The method of claim 2 wherein the sense amplifier enable signal is delayed by an amount selected based on the sensed leakage voltage, the amount selected being chosen from a discrete number of delay choices.

5. The method of claim 2 wherein delaying the sense amplifier enable signal comprises providing the sense amplifier enable signal to a delay circuit and adjusting the amount of delay based on the sense leakage voltage.

6. The method of claim 5 wherein the amount of delay is adjusted by adjusting a capacitance of the delay circuit.

7. The method of claim 6 wherein the amount of capacitance is adjusted by increasing the capacitance as a function of increase of leakage.

8. A memory device comprising:
    a plurality of memory cells arranged in rows and columns, each memory cell coupled to a wordline and at least one bitline;

a plurality of sense amplifiers, each bitline coupled to one of the sense amplifiers;

a dummy bitline; and a sense amplifier enable circuit coupled to the dummy bitline, the sense amplifier enable circuit including an output coupled to at least one of the sense amplifiers, the sense amplifier enable circuit providing an enable signal at the output at a time based on an amount of leakage voltage determined from the dummy bitline.

9. The device of claim 8 wherein the sense amplifier enable circuit includes a delay chain.

10. The device of claim 9 wherein the delay chain includes a power node, wherein a voltage applied to the power node is based on leakage of the dummy bitline.

11. The device of claim 9 wherein the delay chain includes a plurality of serially coupled inverters, each inverter including a reference voltage node, wherein the dummy bitline is coupled between the reference voltage node and a chip reference node.

12. The device of claim 9 wherein the sense amplifier enable circuit includes a plurality of delay chains, the sense amplifier enable circuit further including a select circuit operable to select one of the plurality of delay chains based on the amount of leakage voltage determined from the dummy bitline.

13. The device of claim 9 wherein the delay chain includes:

a first inverter with an input and an output;

a second inverter with an input and an output, the input of the second inverter being coupled to the output of the first inverter;

a capacitor; and a switch coupled between the input of the second inverter and a plate of the capacitor, the switch including a control terminal coupled to the dummy bitline.

14. The device of claim 13 wherein the switch comprises a p-channel field effect transistor.

15. The device of claim 13 wherein the capacitor comprises an MOS transistor with a source and a drain each coupled to a common node.

16. The device of claim 13 wherein the delay chain further includes:

a second capacitor;

a second switch a switch coupled between the input of the second inverter and a plate of the second capacitor, the second switch including a control terminal; and a second dummy bitline coupled to the control terminal of the second switch.

17. The device of claim 16 wherein:

the switch comprises a p-channel field effect transistor;

the second switch comprises an n-channel field effect transistor;

the dummy bitline includes a plurality of dummy memory cells in an "OFF" state; and the second dummy bitline includes a plurality of dummy memory cells at least one of which is in an unselected state.

18. The device of claim 17 wherein each of the dummy memory cells of the second dummy bitline is in a selected state.

19. The device of claim 8 wherein the plurality of memory cells comprises a plurality of static random access memory (SRAM) cells.

20. The device of claim 19 wherein each SRAM cell includes a first inverter with an input and an output;

a second inverter with an input coupled to the output of the first inverter and an output coupled to the input of the first inverter; and an access transistor coupled between the input of the first inverter and the at least one bitline.

21. The device of claim 20 wherein each SRAM cell further includes a second access transistor coupled between the output of the first inverter and a complementary bitline.

22. The device of claim 8 wherein the dummy bitline includes a plurality of dummy cells, each of the dummy cells being held in an unselected state.

23. The device of claim 22 wherein each of the dummy cells store a physical "0."

24. The device of claim 8 wherein the sense amplifier enable circuit includes:

a voltage level subtractor;

a dummy off-cell bitline coupled to the voltage level subtractor, wherein the dummy bitline comprises the dummy off-cell bitline; and a dummy on-cell bitline coupled to the voltage level subtractor.

25. The device of claim 8 wherein the sense amplifier enable circuit includes:

a current level subtractor;

a dummy off-cell bitline coupled to the current level subtractor, wherein the dummy bitline comprises the dummy off-cell bitline; and a dummy on-cell bitline coupled to the current level subtractor.

* * * * *

UNITED STATES PATENT AND TRADEMARK OFFICE
CERTIFICATE OF CORRECTION

PATENT NO.   : 6,831,853 B2
DATED        : December 14, 2004
INVENTOR(S)  : Lin et al.

It is certified that error appears in the above-identified patent and that said Letters Patent is hereby corrected as shown below:

Title page,
Item [54], Title, delete in its entirety and insert therefor -- METHOD AND SYSTEM FOR CONTROLLING AN SRAM SENSE AMPLIFIER CLOCK --

Signed and Sealed this

Twelfth Day of April, 2005

JON W. DUDAS
*Director of the United States Patent and Trademark Office*